(12) United States Patent
Meyer et al.

(10) Patent No.: US 8,878,360 B2
(45) Date of Patent: Nov. 4, 2014

(54) STACKED FAN-OUT SEMICONDUCTOR CHIP

(75) Inventors: Thorsten Meyer, Regensburg (DE); Gerald Ofner, Regensburg (DE); Sven Albers, Regensburg (DE)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 13/548,705

(22) Filed: Jul. 13, 2012

(65) Prior Publication Data

US 2014/0015131 A1    Jan. 16, 2014

(51) Int. Cl.
*H01L 23/48* (2006.01)
(52) U.S. Cl.
USPC .......................... 257/734; 257/678
(58) Field of Classification Search
USPC ................................... 257/678, 734
See application file for complete search history.

(56) References Cited

U.S. PATENT DOCUMENTS

| | | | |
|---|---|---|---|
| 6,714,418 B2 | 3/2004 | Frankowsky et al. | |
| 7,858,440 B2 | 12/2010 | Pressel et al. | |
| 8,232,657 B2* | 7/2012 | Boon et al. | 257/786 |
| 2008/0157358 A1* | 7/2008 | Yang | 257/737 |
| 2008/0174008 A1* | 7/2008 | Yang et al. | 257/723 |
| 2008/0217761 A1* | 9/2008 | Yang et al. | 257/700 |
| 2012/0038064 A1* | 2/2012 | Camacho et al. | 257/777 |

FOREIGN PATENT DOCUMENTS

DE    10164800 A1    8/2003

OTHER PUBLICATIONS

Wojnowski et al., "Package Trends for Today's and Future mm-Wave Applications," Infineon, 55 pp., available at https://safe.nrao.edu/wiki/pub/Main/EuropeanMicrowaveWeek08/WFR14-1.pdf.
STATSChipPAC, eWLB-Embedded Wafer-Level Ball Grid Array Brochure; pp. 1-2, available at http://www.statschippac.com/ewlb.
Riley, Under Bump Metallization (UBM), Tutorial #11, Sep. 2001, pp. 1-2, available at flipchips.com/tutorial/process/under-bump-metallization-ubm/.

* cited by examiner

*Primary Examiner* — David Vu
*Assistant Examiner* — Brandon Fox (57) ABSTRACT

A stacked semiconductor device and method of manufacturing a stacked semiconductor device are described. The semiconductor device may include a reconstituted base layer having a plurality of embedded semiconductor chips. A first redistribution layer may contact the electrically conductive contacts of the embedded chips and extend beyond the boundary of one or more of the embedded chips, forming a fan-out area. Another chip may be stacked above the chips embedded in the base layer and be electrically connected to the embedded chips by a second redistribution layer. Additional layers of chips may be included in the semiconductor device.

10 Claims, 11 Drawing Sheets

STACKED FAN-OUT SEMICONDUCTOR CHIP

BACKGROUND

Several solutions for stacking semiconductor chips exist. In a wire bond stack, one chip may be stacked onto another chip, and the electrical contacts between the two chips may be created by wire bonding. These wire bond stacks may have large dimensions and restricted electrical performance. In a flip chip wire bond stack, solder bumps may be placed on the top side of a chip, and the chip may be flipped so that the top side (having the solder bumps) may contact electrical contacts positioned on a substrate. A wire bonded chip may then be attached to the bottom of a flip chip, forming a stack. Additional chips stacked on the package would require wire bonding, resulting in a large package size and restricted electrical performance. In through silicon via (TSV) chip stacking, vias may extend (from the active side of a chip) through the chip to provide electrical connection to the inactive side of the chip. TSV technology, however, is costly, and the supply chain for TSV chips is still being developed. What is needed is a chip stacking technology that is potentially less expensive and results in a chip package that may be relatively small and may have superior electrical performance.

SUMMARY

In some aspects, a semiconductor device formed by a chip stacking technology may include multiple layers, including: a base layer having a first semiconductor chip, the first semiconductor chip having at least one electrically conductive contact at a first side of the first semiconductor chip, a first redistribution layer contacting the at least one electrically conductive contact of the first semiconductor chip, wherein the first redistribution layer may extend beyond the boundary of the first semiconductor chip, a second semiconductor chip having a first side and a second side, the second semiconductor chip having at least one electrically conductive contact at the first side of the second semiconductor chip, and an adhesive layer positioned between the first side of the first semiconductor chip and the second side of the second semiconductor chip, wherein the second semiconductor chip may be positioned directly on the adhesive layer.

The semiconductor device may further include: an electrically insulating layer positioned at least partially above the first side of the second semiconductor chip, wherein the electrically insulating layer may have at least one via exposing the first redistribution layer, and a second redistribution layer contacting the at least one electrically conductive contact of the second semiconductor chip, wherein the second redistribution layer may be electrically connected to the first redistribution layer by the at least one via. At least one solder ball may contact the second redistribution layer.

The semiconductor device may have multiple layers. For example, the semiconductor device may include: a third semiconductor chip having a first side and a second side, the third semiconductor chip having at least one electrically conductive contact at the first side of the third semiconductor chip, a second adhesive layer positioned between the first side of the second semiconductor chip and the second side of the third semiconductor chip, wherein the third semiconductor chip may be positioned directly on the second adhesive layer, a second electrically insulating layer positioned at least partially above the first side of the third semiconductor chip, wherein the second electrically insulating layer may have at least one via exposing the second redistribution layer, and a third redistribution layer contacting the at least one electrically conductive contact of the third semiconductor chip, wherein the third redistribution layer may be electrically connected to the second redistribution layer by the at least one via of the second electrically insulating layer.

In some aspects, the base layer of the semiconductor device may be a reconstituted wafer, and the first semiconductor chip may be embedded in the reconstituted wafer. A plurality of semiconductor chips may also be embedded in the reconstituted wafer. The plurality of semiconductor chips may include at least one passive semiconductor chip and at least one active semiconductor chip.

The first semiconductor chip and the second semiconductor chip of the semiconductor device may form a single integrated circuit package. In some aspects, the second semiconductor chip might not be releasable from the single integrated circuit package without damaging the package.

In further aspects, the adhesive layer of the semiconductor device may be positioned at least partially on the first redistribution layer. The first semiconductor chip and the second semiconductor chip may be integrated circuits.

In additional aspects, the semiconductor device may include: at least one wire electrically connecting the at least one electrically conductive contact of the second semiconductor chip to the first redistribution layer, and an electrically insulating layer positioned at least partially above the first side of the second semiconductor chip and the at least one wire, wherein the electrically insulating layer may have at least one via exposing the first redistribution layer.

Also described herein is a semiconductor device having: a base layer having a first semiconductor chip, the first semiconductor chip having at least one electrically conductive contact at a first side of the first semiconductor chip, a first redistribution layer contacting the at least one electrically conductive contact of the first semiconductor chip, wherein the first redistribution layer may extend beyond the boundary of the first semiconductor chip, and a semiconductor flip chip having a first side and a second side, the semiconductor flip chip having at least one electrically conductive contact at the first side of the semiconductor flip chip. The first side of the first semiconductor chip may face the first side of the semiconductor flip chip. The semiconductor device may also include: an electrically insulating layer positioned at least partially above the second side of the semiconductor flip chip, wherein the electrically insulating layer may have at least one via exposing the first redistribution layer, and a second redistribution layer electrically connected to the at least one electrically conductive contact of the semiconductor flip chip through the at least one via and the first redistribution layer.

A method for manufacturing a semiconductor device is also described herein. The method may include: forming a first redistribution layer on a surface of a base layer having a first semiconductor chip, the first semiconductor chip having at least one electrically conductive contact at a first side of the first semiconductor chip, wherein the first redistribution layer may contact the at least one electrically conductive contact of the first semiconductor chip; applying an adhesive layer at least partially on a surface of the first redistribution layer; positioning a second semiconductor chip on the adhesive layer; applying a polymer layer around the second semiconductor chip; forming at least one via through the polymer layer, wherein the at least one via may expose the first redistribution layer; and forming a second redistribution layer on a surface of the polymer layer. The second semiconductor chip may have at least one electrically conductive contact at a first side of the second semiconductor chip, and wherein positioning the second semiconductor chip may include positioning a second side of the second semiconductor chip on the adhesive layer, the second side different from the first side. The method may further include: forming an electrically insulating layer at least partially on the first side of the second semiconductor chip; and forming at least one via through the insulating layer, wherein the at least one via may expose the first redistribution layer.

In some aspects, the method may further include forming a second redistribution layer on the electrically insulating layer, wherein the second redistribution layer electrically may connect the at least one electrically conductive contact of the second semiconductor chip to the first redistribution layer by the at least one via. The method may further include positioning at least one solder ball on the second redistribution layer.

The method may include applying a second adhesive layer at least partially on a surface of the second redistribution layer; positioning a third semiconductor chip on the second adhesive layer; forming a second electrically insulating layer at least partially on the third semiconductor chip; forming at least one via through the second insulating layer, wherein the at least one via of the second insulating layer may expose the second redistribution layer; and forming a third redistribution layer on the second electrically insulating layer, wherein the third redistribution layer electrically may connect at least one electrically conductive contact of the third semiconductor chip to the second redistribution layer by the at least one via of the second insulating layer.

The method may include grinding the base layer to remove excess material. In some aspects, the base layer may be a reconstituted wafer, and the first semiconductor chip may be embedded in the reconstituted wafer. The method may further include electrically connecting at least one electrically conductive contact of the second semiconductor chip to the first redistribution layer using a wire before applying the polymer layer.

These and other aspects of the disclosure will be apparent upon consideration of the following detailed description.

BRIEF DESCRIPTION OF THE DRAWINGS

A more complete understanding of the present disclosure and the potential advantages of various aspects described herein may be acquired by referring to the following description in consideration of the accompanying drawings, in which like reference numbers indicate like features, and wherein.

It is noted that one or more of the drawings may not necessarily be drawn to scale.

DETAILED DESCRIPTION

Figure 1A:
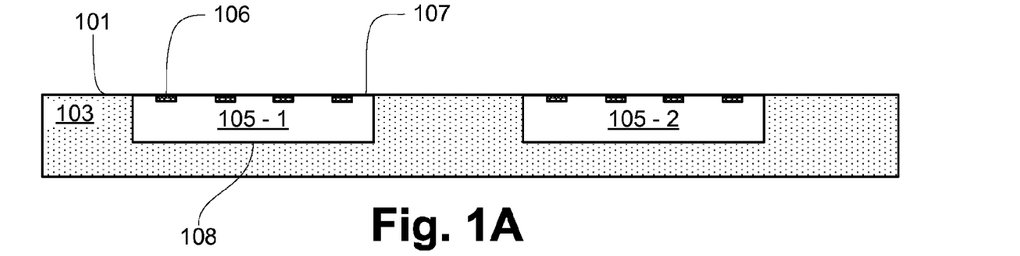
FIGS. 1A-1K illustrate examples of side cutaway views of a semiconductor device (or portions thereof) and/or an example method of manufacturing a semiconductor device in accordance with one or more aspects described herein.

FIGS. 1A-1K illustrate examples of side cutaway views of a semiconductor device (or portions thereof) and/or an example method of manufacturing a semiconductor device in accordance with one or more aspects described herein. In FIG. 1A, a base (substrate) layer 101 may be provided. The base layer 101 may be a reconstituted wafer, such as a reconstituted wafer having fan-out portions (e.g., a Wafer Level Ball (WLB) or Embedded Wafer Level Ball (eWLB) wafer). The reconstituted wafer may be formed by selecting a plurality of semiconductor chips 105 (which may be dies), illustrated by way of example as chips 105-1 and 105-2, that may be known and/or tested to be good (e.g., functioning). The semiconductor chips 105 may be taken from a wafer from which the chips 105 were formed (e.g., by dicing a silicon wafer) and placed onto a carrier using adhesive foil. The chips 105 may be placed on the carrier face up (e.g., the active side of the chips 105 having electrically conductive (e.g., metal) contacts 106 facing up) or face down (e.g., the active side of the chips having electrically conductive contacts 106 facing down) to form a first semiconductor chip 105 layer. If the density of the chips 105 in the original silicon wafer is greater than the intended density of the reconstituted wafer 101 (i.e., if the distance between the chips 105 is smaller in the original silicon wafer than the distance between the chips 105 in the base layer 101), the chips 105 removed from the original silicon wafer may be placed on the carrier at greater distances from one another than the chips 105 were on the original silicon wafer. By spreading out the chips 105, a fan-out area may be formed, as will be described in further detail in the examples below.

An electrically insulating layer 103, such as a molding, may be formed around chips 105 to create the base layer 101. For example, the base layer 101 may be created by compression molding to create a round wafer, a rectangular wafer, or any other shape wafer. Thus, the semiconductor chips 105 may be at least partially embedded in the base layer 101 through the molding process. The electrically conductive contacts 106 may be exposed using any method available to one of ordinary skill in the art. For example, the contacts 106 may be exposed by grinding, laser removal, and/or a combination of grinding and laser removal of the insulating layer 103. The base layer 101 may be used as the starting base for stacking additional layers and/or chips. As such, additional semiconductor chip carrying systems might not be needed.

Semiconductor chips 105 embedded in the reconstituted wafer may include a first side 107 (referred to herein as a "top" side, regardless of the actual orientation relative to gravity or to the remainder of the device) having a plurality of electrically conductive contacts 106. The contacts 106 may be formed by depositing any electrically conductive material, such as polysilicon and/or metal (e.g., aluminum), onto a semiconductor chip 105. The contacts 106 may also be covered (wholly or partially) by a metal structure, such as a copper cylinder, pillar, or other structure. An exemplary metal structure may be, for example, 7 to 20 μm thick. The metal structure may protect the contacts 106 during the removal of layers and/or material from the semiconductor chip, such as during laser drilling. Some layer and/or material removal processes, such as photolithography, might not require the metal structure to protect the contacts 106. Thus, metal structures might not need to cover the contacts 106 if an electrically insulating layer 109 is structured by photolithography, as will be described in further detail in the examples below. Any of the chip contacts described below may similarly include metal structures coving the contacts to protect them during layer and/or material removal. The contacts may have been formed as part of the process for forming the original silicon wafer. In some aspects, the bare contacts 106 might not be solderable because redistribution layers, passive layers, solder stops, and/or solder balls have not been formed on the reconstituted wafer 101. Semiconductor chips 105 may also have a second opposite side 108 (e.g., a "bottom" side) that may or may not have any conductive contacts.

Figure 1B:
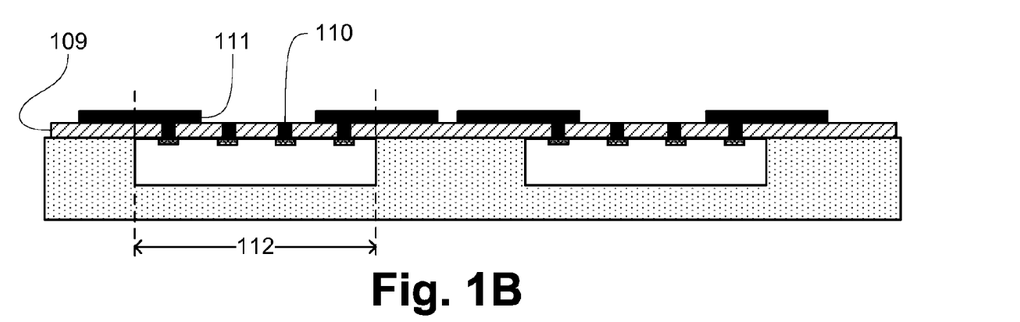

In FIG. 1B, an electrically insulating layer 109 (e.g., a dielectric) may be formed on the reconstituted wafer 101. Contacts 106 may be exposed, such as by using photolithography and/or laser techniques. Metallization extensions 110 (which may be made of copper or other conductive material) may be formed on the exposed contacts 106. A first redistribution layer 111 may be formed above the dielectric 109. The first redistribution layer 111 may include a plurality of redistribution lines, at least some of which may extend beyond the boundaries of the one or more semiconductor chips 105, forming fan-out areas in the regions between the chips 105. By fanning out the contacts 106 outside of the footprint 112 of each of the chips 105, the contacts 106 may be more readily accessible (e.g., to additional semiconductor chips and/or other types of components, contacts, etc.). Redistribution layers may be applied using various thin film and/or printed circuit board (PCB) deposition processes, including sputtering and plating, electroless seed layer application, electroplating, printing, and/or other deposition processes.

Figure 1C:
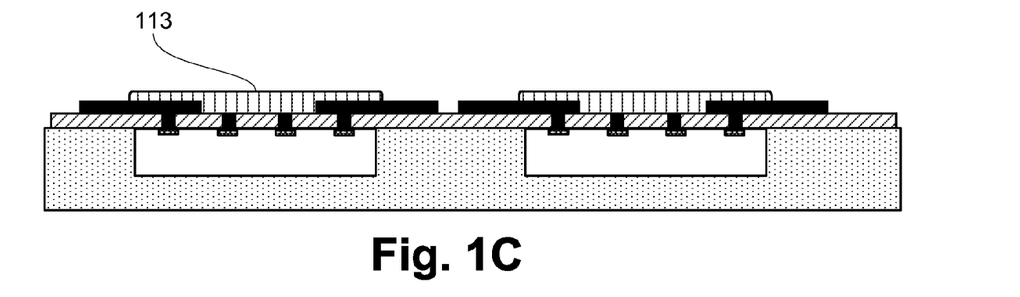

In FIG. 1C, an adhesive layer 113 may be formed above the first semiconductor chip 105 layer (e.g., via printing, lamination, dispensing, etc.), such as on the dielectric 109 and/or the first redistribution layer 111. Portions of the first redistribution layer 111 may remain exposed to facilitate chip stacking. For example, adhesives may be applied to pick and place positions of a second layer of semiconductor chips, as will be described in further detail in the examples below. Adhesives may include, for example, epoxy, polyimide, silicone, other materials, and combinations thereof. Furthermore, the adhesives may be filled or unfilled with a filler, such as silicon and carbon, among other types of fillers. While the adhesive layer 113 is shown as a patterned layer, the adhesive layer 113 may be a continuous layer between the chips 105. Also, boundaries of the adhesive layer 113 may be at or within the footprint of each of the chips 105, or the adhesive layer 113 may extend beyond the footprint of each of the chips 105.

Figure 1D:
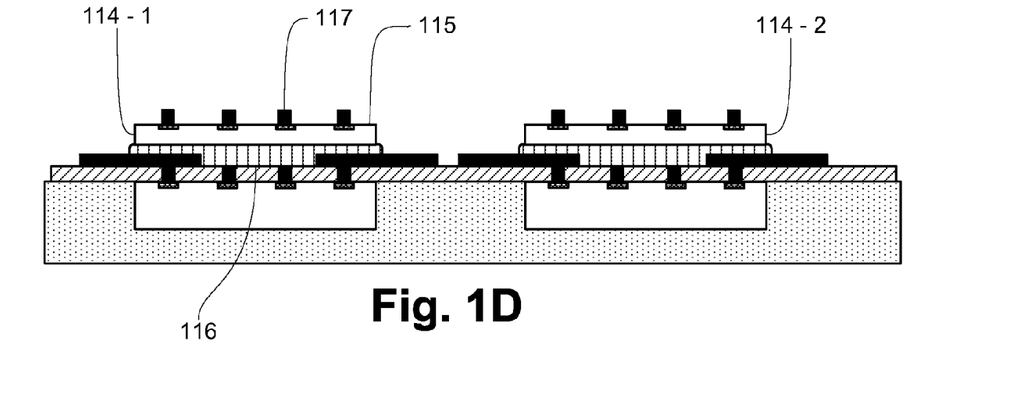

In FIG. 1D, a second layer of semiconductor chips 114 (illustrated by way of example as chips 114-1 and 114-2) may be positioned directly on the adhesive 113. Pick and place machines may be used. The second semiconductor chips 114 may each include a first side 115 (e.g., a top side) having a plurality of electrically conductive contacts. Metallization extensions 117 (e.g., made of copper or other conductive material) may be formed on the contacts of the second semiconductor chip 114, in the same or a similar manner as for the first layer of semiconductor chips 105. In some aspects, the metallization extensions 117 may be pre-applied to the contacts of the chips 114, such as in the form of copper under bump metallization (UBM). The second chips 114 may also each have a second side 116 (e.g., a bottom side) that may or may not have any conductive contacts. The second side 116 may be placed directly on the adhesive 113.

Figure 1E:
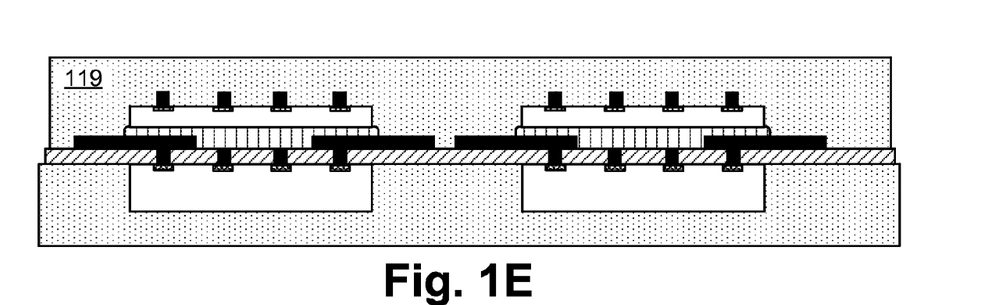
Figure 1F:
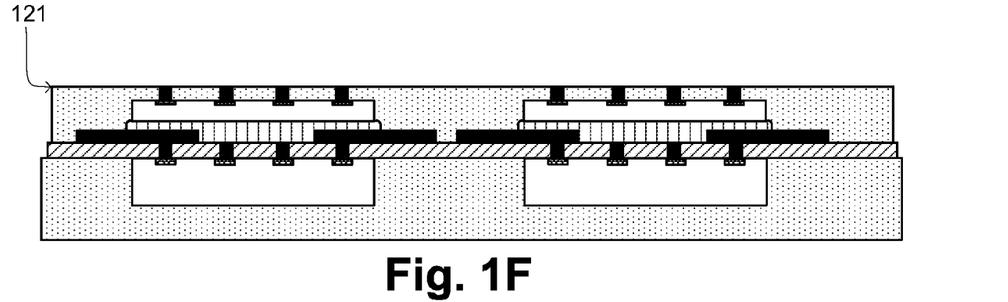

In FIG. 1E, an electrically insulating layer 119 (e.g., a molding layer or lamination layer) may be formed around the second semiconductor chip(s) 114, such that the second chip(s) 114 are at least partially embedded in the insulating layer 119. The insulating layer 119 may be applied using any semiconductor manufacturing process step, such as lamination, compression molding, printing, etc. In FIG. 1F, the insulating layer 119 may be reduced in size (e.g., thinned), such as by grinding and/or laser drilling of the insulating layer. Grinding the insulating layer 119 (e.g., to a position 121) may expose the conductive extensions 117 of the second semiconductor chip(s) 114.

Figure 1G:
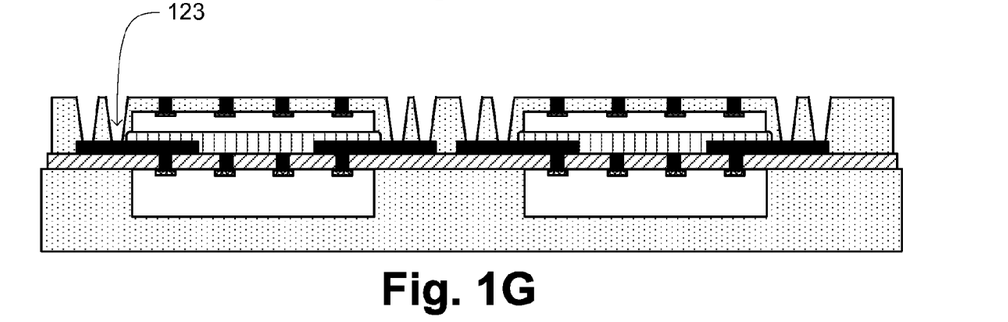

In FIG. 1G, one or more vias 123 (e.g., interconnect pathways) may be formed in the electrically insulating layer 119, such as by drilling (e.g., laser drilling) and/or photolithography processes. The vias 123 may expose the conductive extensions 117 of the second semiconductor chips 114 and/or the first redistribution layer 111. For example, the drilling may be caused to stop at the first redistribution layer 111 and/or one or more conductive extensions 117.

Figure 1H:
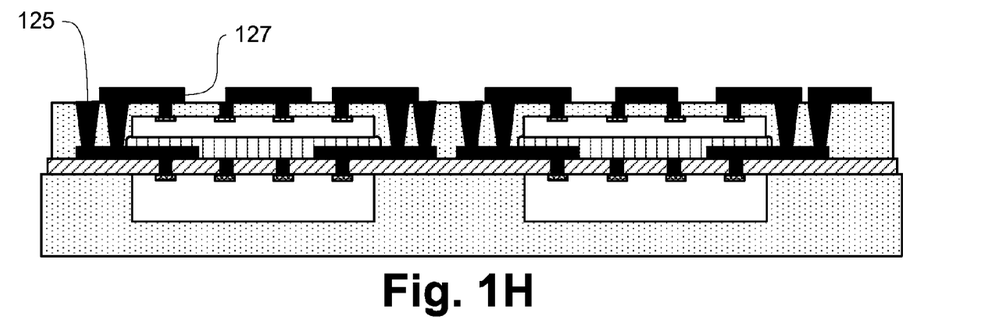

In FIG. 1H, the vias 123 may be filled with one or more conductive materials 125, such as copper, in order to permit electrical access to the first redistribution layer 111 and/or conductive extensions 117 of the second semiconductor chip(s) 114. A second redistribution layer 127 may also be formed (e.g., by sputtering and plating, electroless seed layer plating, or electroplating) above the molding layer 119. In some aspects, the vias 123 may be filled together with formation of the redistribution layer 127. Alternatively, the vias 123 may be filled separately from the formation of the redistribution layer 127. For example, the vias 123 may first be filled (e.g., by printing, electroless plating, etc.). Then, the redistribution layer 127 may be formed. The vias 123 may be completely or partially filled with conductive material. Partially-filled vias may be plugged vias, where a redistribution-type layer is passed down through the vias, and the remainder of the via is filled separately or by an electrically insulating material, such as a second electrically insulating layer 129 as will be described in further detail in the examples below. The second redistribution layer 127 may create a second fan-out interconnect of the conductive contacts of the first and second semiconductor chips. For example, the contacts may be fanned out outside the footprint of each of the first semiconductor chips 105, outside the footprint of each of the second semiconductor chips 114, and/or outside the footprints of both the first and second semiconductor chips 105, 114. The second redistribution layer 127 may be electrically connected to the first redistribution layer 111 by the conductive material(s) 125 filling the at least one via 123. The second redistribution layer 127 may similarly be electrically connected to one or more conductive contacts of the second semiconductor chips 114. In some aspects, the electrical connection between the second redistribution layer 127 and the first redistribution layer 111 and/or conductive extensions 117 might not require any solder, potentially simplifying the manufacturing processes used to create the semiconductor device and/or potentially increasing the robustness of the semiconductor device (e.g., resistance to high heat).

Figure 1I:
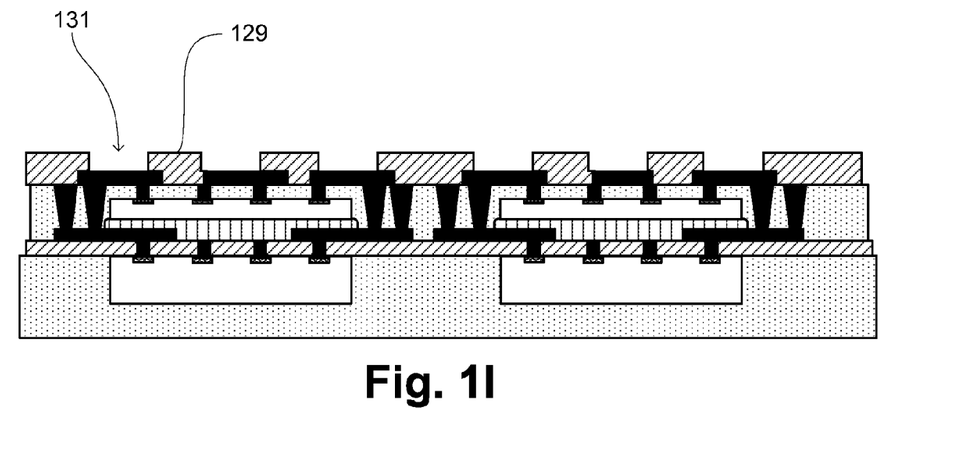
Figure 1J:
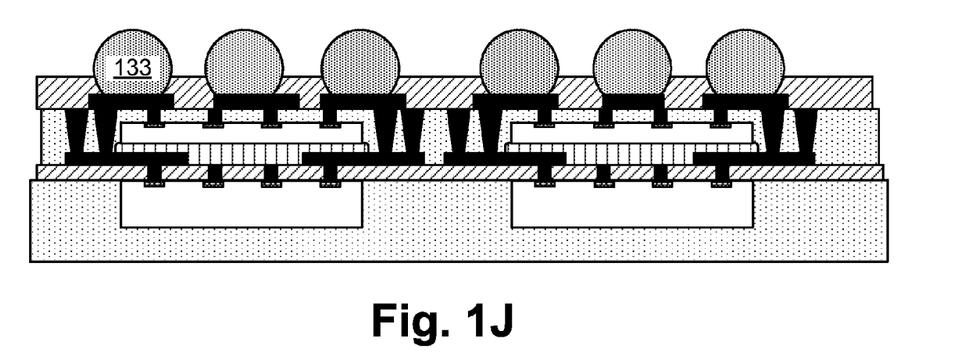
Figure 1K:
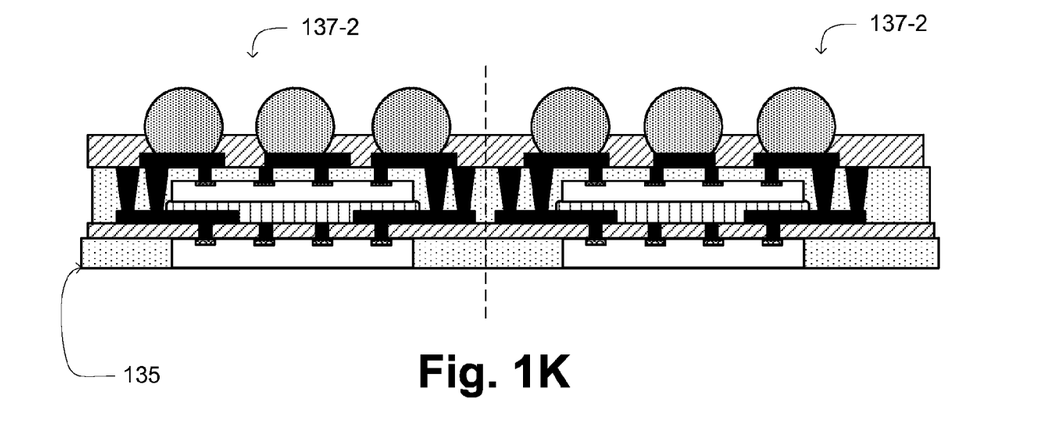

In FIG. 1I, a second electrically insulating layer 129 (e.g., a dielectric) may be formed on the second redistribution layer 127. The second redistribution layer 127 may be exposed at one or more locations 131 (e.g., by laser drilling, photolithography, etc.). In FIG. 1J, a solder stop layer, and/or solder balls 133 (e.g., balls or semi-balls) may be applied. In FIG. 1K, the bottom of the base layer 101 (e.g., molding 103) facing away from the side on which the solder balls 133 were (or will be) applied may be grinded to reduce the height of the structure, e.g., to position 135. The structure may then be separated (e.g., diced) between each of the stacked sets of chips and/or other components, such as at the location shown by the broken line in FIG. 1K, resulting in a plurality of separate semiconductor device packages. For example, in the example of FIG. 1K, two semiconductor device packages 137-1 and 137-2 are shown, each of which may have a plurality of semiconductor chips (e.g., a first semiconductor chip 105 and a second semiconductor chip 114). Alternatively, reference numbers 137-1 and 137-2 may form a single semiconductor package. The first semiconductor chips 105 and second semiconductor chips 114 might not be releasable from the respective packages 137.

Figure 2:
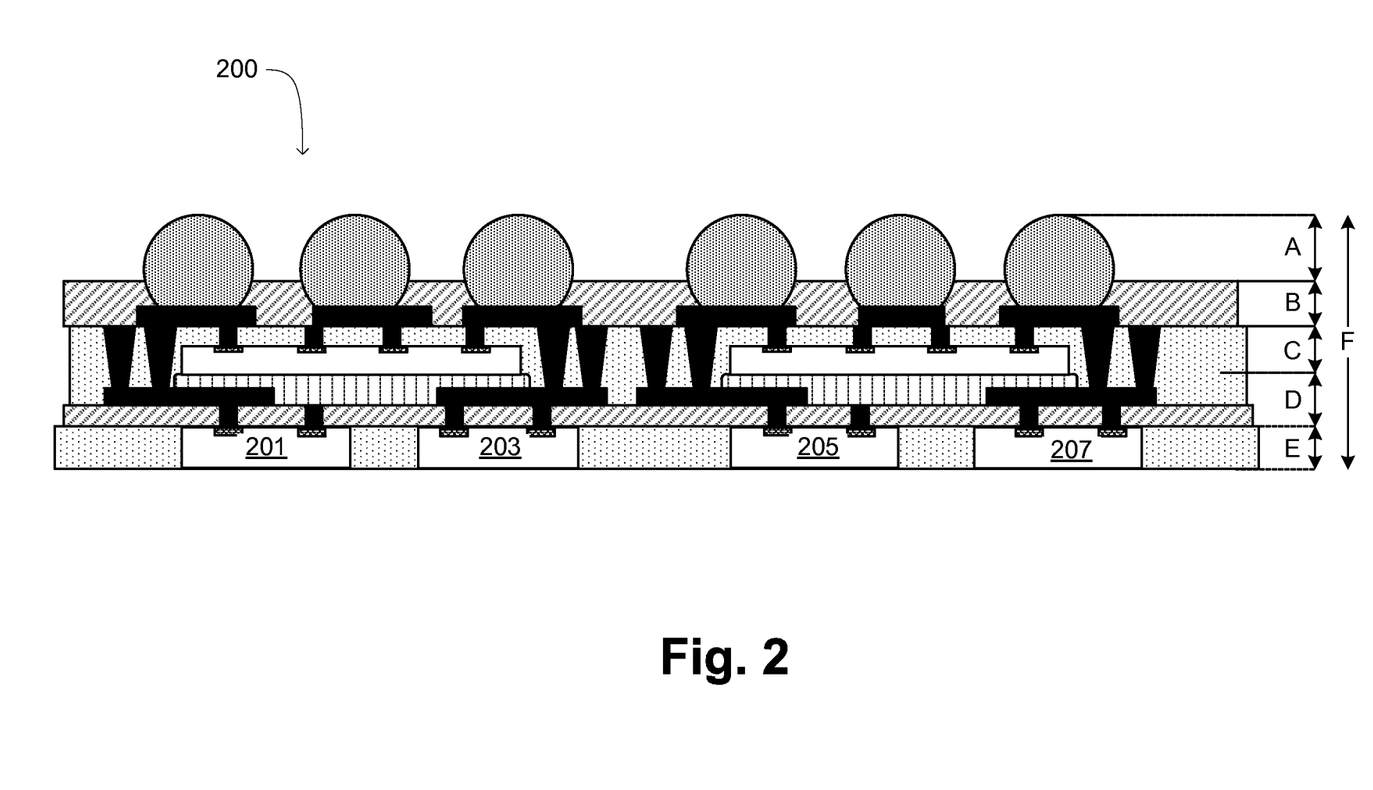
FIG. 2 illustrates another example of a side cutaway view of a semiconductor device (or portion thereof) in accordance with one or more aspects described herein.

FIG. 2 illustrates another example of a side cutaway view of a semiconductor device 200 (or portion thereof) in accordance with one or more aspects described herein. Multiple semiconductor chips (e.g., chips 201, 203, 205, and 207) and/or other active or passive components (as will be described in further detail in the examples below) may be embedded in the reconstituted wafer or any other layer. The example semiconductor package 200 may have a very low package height. For example, the solder ball height A may be in the range of 200 μm to 300 μm, such as approximately 250 μm (with a pitch of approximately 0.50 mm between solder balls). The solder ball height A may be in the range of 150 μm to 250 μm, such as approximately 200 μm (with a pitch of approximately 0.40 mm). The dielectric and second semiconductor height B may be in the range of 5 μm to 40 μm, such as approximately 30 μm. The second semiconductor chip and second metallization extension height C may be in the range of 20 μm to 250 μm, such as approximately 120 μm. The second metallization height may in the range of 10 μm to 30 μm for laser drilled connections and 5 μm to 15 μm for other types of connections. For example, the second semiconductor chip may have a height of approximately 100 μm, and the metallization extension may have a height of approximately 20 μm. In some aspects, the second chip may have an even lower height, such as approximately 50 μm. The first dielectric layer, first redistribution layer, and adhesive height D may be approximately 40 μm. The molded (and grinded) reconstituted wafer height E may be approximately 100 μm. Accordingly, the three dimensional semiconductor package 200 having two layers of semiconductor chips may have a total height F of approximately 490 μm (or approximately 440 μm if the second semiconductor chip is approximately 50 μm in height). Similarly, a package having three layers of semiconductor chips may have a total height of approximately 600 μm. The example dimensions described herein may also apply to other embodiments, such as the example embodiments of FIGS. 1K, 3, 4E, 5D, 6C, and 7. Again, the stacked sets of chips and/or other components may be separated (e.g., diced) to form individual packages.

In addition to potential size advantages embodied by the examples included in this disclosure, the semiconductor device 200 may be less expensive to manufacture than packages that utilize through silicon vias (TSVs), which may be fairly expensive to manufacture. TSVs may be avoided if desired, for example, by fanning out the conductive pads of the semiconductor chips and using one or more redistribution layers. Furthermore, the electrical performance of the stack may benefit from utilization of layers of redistribution material and short connections between the redistribution layers. Additional stacking of chips and/or packages are possible. For example, a package may include more than three layers. A package may also be stacked onto another package.

Figure 3:
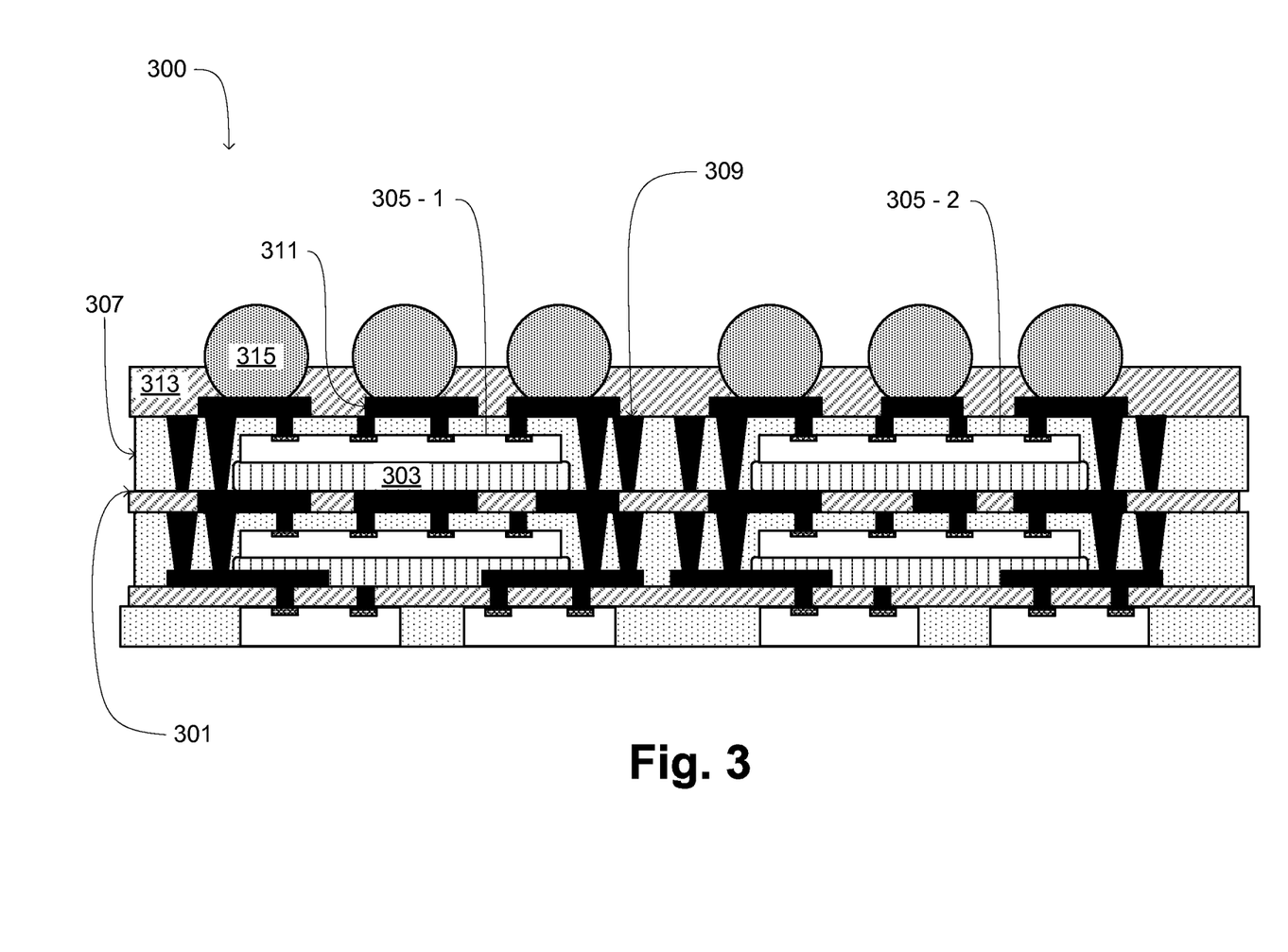
FIG. 3 illustrates an additional example of a side cutaway view of a semiconductor device (or portion thereof) in accordance with one or more aspects described herein.

FIG. 3 illustrates an additional example of a side cutaway view of a semiconductor device 300 (or portion thereof) in accordance with one or more aspects described herein. The semiconductor device 300 may have three (or more) layers of semiconductor chips. The method of manufacturing a device with three (or more) layers may continue from the intermediate semiconductor device illustrated in FIG. 1H. A second adhesive layer 303 may be formed (e.g., via printing, lamination, dispensing, etc.) at pick and place positions of a third layer of a plurality of semiconductor chips 305 (shown in FIG. 3 by way of example as chips 305-1 and 305-2). The third semiconductor chip 305 may be positioned directly on the adhesive 303. The third semiconductor chip 305 may have a first side (e.g., a top side) having a plurality of conductive contacts and/or conductive extensions. The third semiconductor chips 305 may also have a second side (e.g., a bottom side) that is positioned on the adhesive 303. A third electrically insulating layer 307 may be formed around the third semiconductor chips 305, and a plurality of vias 309 may be formed (e.g., by drilling) to expose the second redistribution layer and/or the conductive extensions of the third semiconductor chip 305. A third redistribution layer 311 may be formed above the dielectric 307. As previously described, the third redistribution layer 311 may fan out the conductive contacts of the first layer of semiconductor chips 105, the second layer of semiconductor chips 114, and/or the third layer of semiconductor chips 305. An electrically insulating layer 313 may be formed above and/or around the third redistribution layer 311, and drilling and/or other photolithography techniques may expose the third redistribution layer 311. These steps may be replicated any number of times to form any number of stacked layers of semiconductor chips. In the final layer, solder stop and/or solder balls 315 may be applied to form the semiconductor package 300. Similar to other embodiments, the stacked sets of chips and/or other components may be separated (e.g., diced) to form individual packages.

Figure 4A:
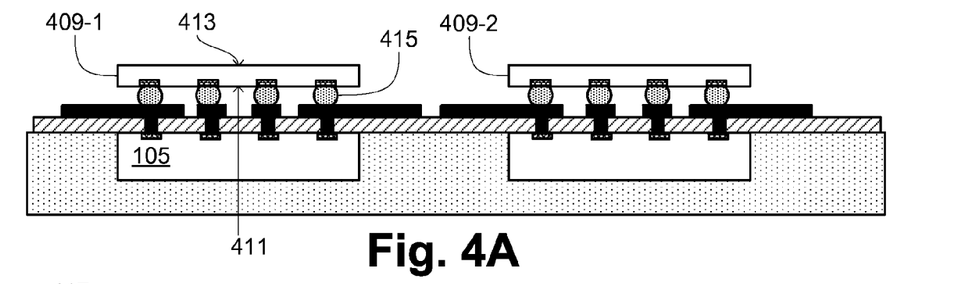
FIGS. 4A-4E illustrate examples of side cutaway views of a semiconductor device (or portions thereof) having a flip chip package and/or an example method of manufacturing a semiconductor device having a flip chip package in accordance with one or more aspects described herein.

FIGS. 4A-4E illustrate examples of side cutaway views of a semiconductor device (or portions thereof) having one or more flip chip packages and/or an example method of manufacturing a semiconductor device having one or more flip chip packages in accordance with one or more aspects described herein. The method of manufacturing the semiconductor device having one or more flip chip packages may continue from the intermediate semiconductor device illustrated in FIG. 1B. Instead of applying an adhesive layer as illustrated in FIG. 1C, flip chip packages may be used, such as flip chip packages 409-1 and 409-2. In FIG. 4A, flip chip packages 409 may have a first side 411 (e.g., an active side) having a plurality of conductive contacts. Flip chip packages 409 may also have a second side 413 that might not have any electrically conductive contacts. Flip chip packages 409 may have a plurality of solder bumps 415 (e.g., flip chip μ-bumps) electrically connected to the conductive contacts of the flip chip package 409. The solder bumps 415 may be attached to the conductive contacts by a metallization element, such as a copper UBM. With the solder bumps 415 facing "up," the flip chip packages 409 may be flipped and positioned directly on the first redistribution layer 111. When flipped, the active side 411 of the flip chip packages 409 may be facing the active side of the embedded semiconductor chips 105. Electrical and/or physical connection may be maintained by soldering the solder bumps 415 onto the first redistribution layer 111, and/or by using thermocompression bonding, and/or other semiconductor device manufacturing techniques.

Figure 4B:
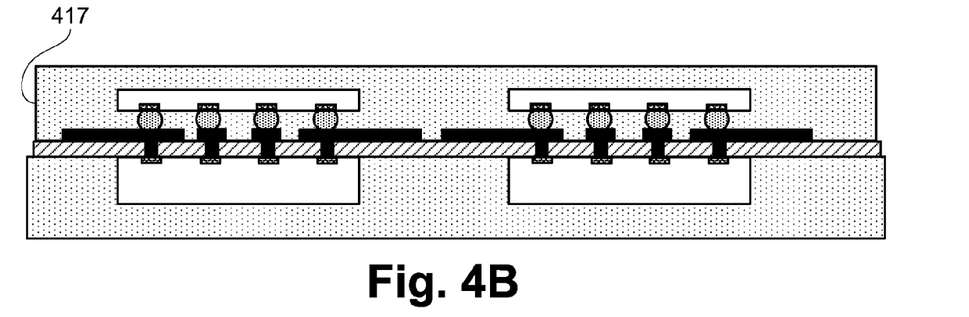
Figure 4C:
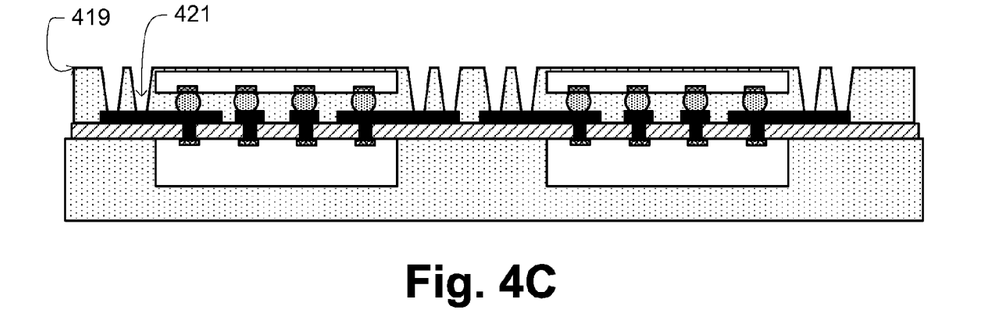
Figure 4D:
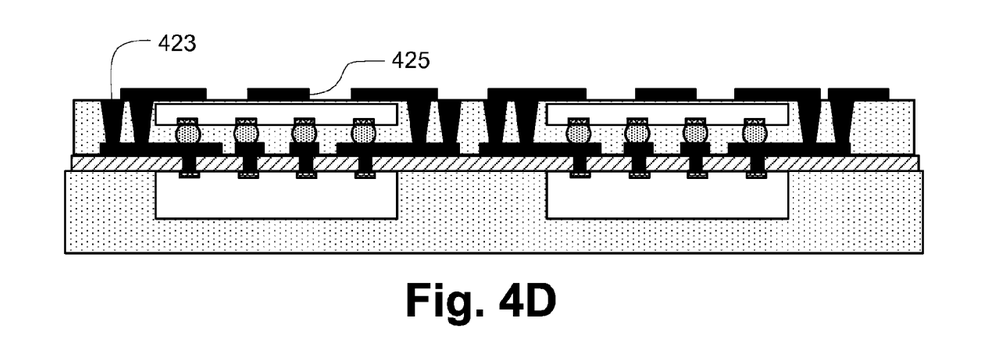

In FIG. 4B, the flip chip packages 409 may be underfilled, over-molded, and/or over/undermolded (e.g., molded underfill (MUF)) with electrically insulating materials, forming an electrically insulating layer 417 (e.g., a molding layer). For example, a material capable of flowing between the gaps formed by the solder bumps 415 may be used for underfilling. In FIG. 4C, the electrically insulating layer 417 may be grinded to reduce package height (e.g., to position 419). A plurality of vias 421 (e.g., interconnect pathways) may be formed (e.g., by laser drilling, photolithography, etc.) to expose the first redistribution layer. In FIG. 4D, the vias 421 may be filled with electrically conductive material 423, and a second redistribution layer 425 may be formed to fan out the electrical contacts of the first semiconductor chip embedded in the reconstituted wafer and/or the flip chip packages 409. The steps illustrated in FIGS. 4A-4D may be repeated to form a semiconductor package having any number of layers of semiconductor chips.

Figure 4E:
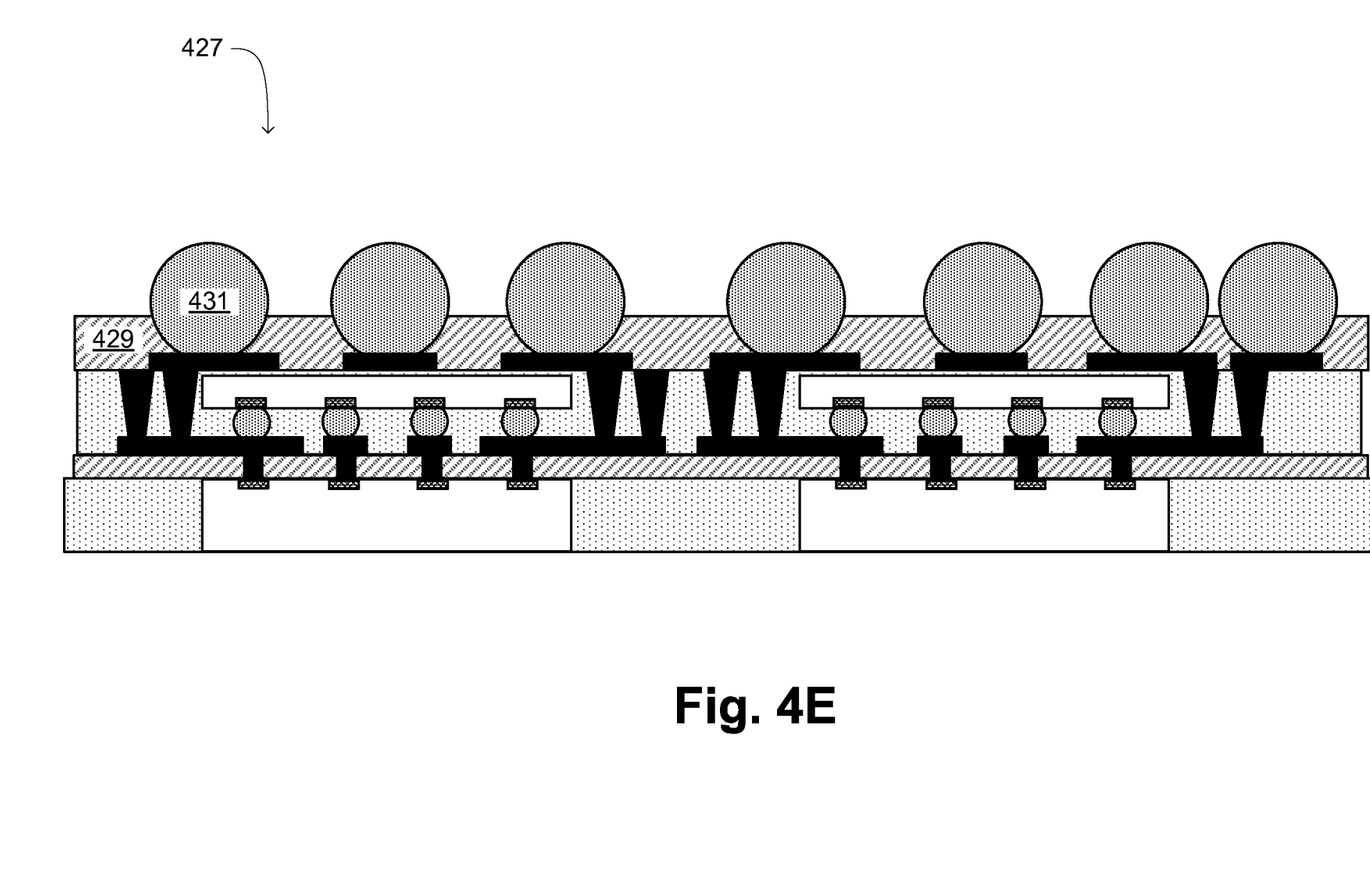

FIG. 4E illustrates an example of a side cutaway view of a semiconductor package 427 having two layers of semiconductor chips (including a flip chip layer) in accordance with one or more aspects described herein. The semiconductor package 427 may have another electrically insulating layer 429, solder stop, and/or solder balls 431. Similar to other embodiments, the stacked sets of chips and/or other components may be separated (e.g., diced) to form smaller individual packages.

Figure 5A:
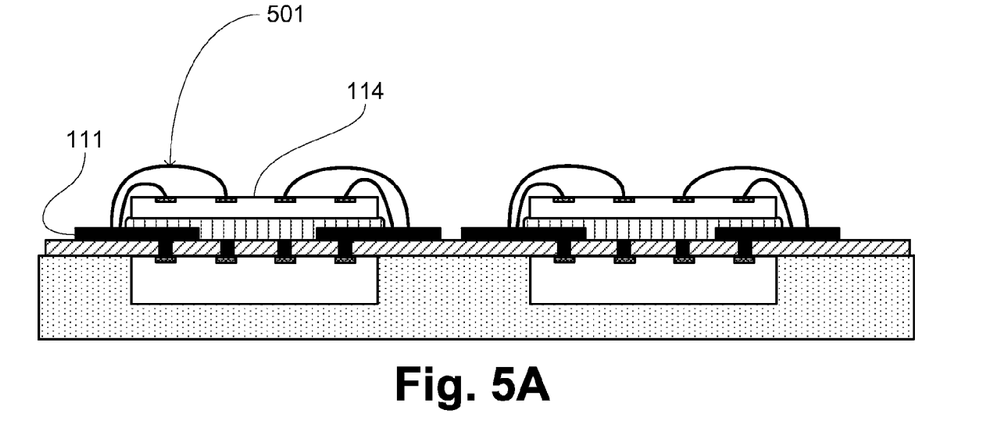
FIGS. 5A-5D illustrate examples of side cutaway views of a semiconductor device (or portions thereof) having wires and/or an example method of manufacturing a semiconductor device having wires in accordance with one or more aspects described herein.
Figure 5B:
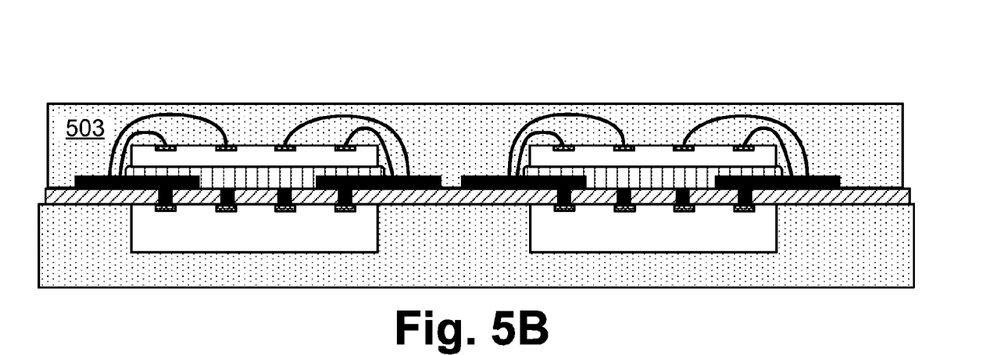
Figure 5C:
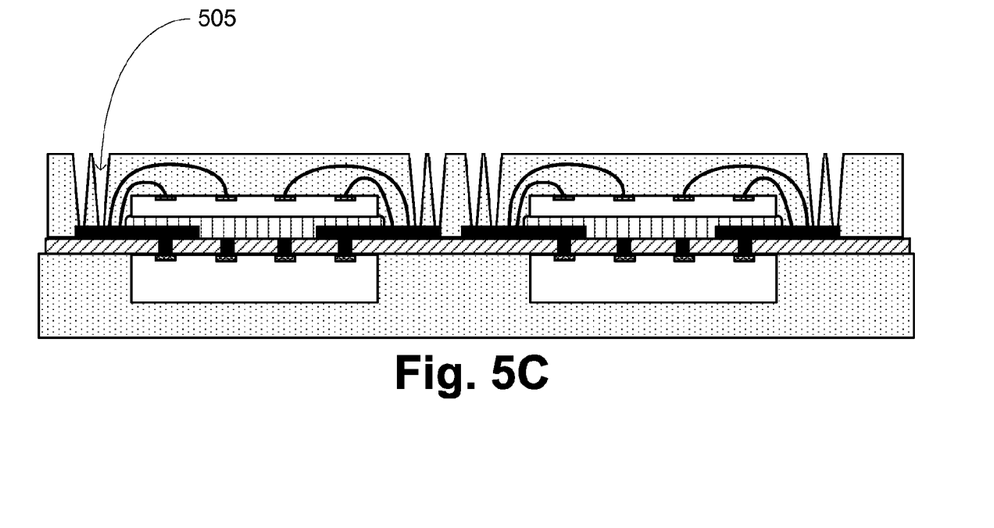

FIGS. 5A-5D illustrate examples of side cutaway views of a semiconductor device (or portions thereof) having wires and/or an example method of manufacturing a semiconductor device having wires in accordance with one or more aspects described herein. The method of manufacturing the semiconductor device having wires may continue from the intermediate semiconductor device illustrated in FIG. 1D. Because wires may be directly connected to the bare chips (e.g., second chip 114), the conductive extensions 117 might not be needed. In FIG. 5A, conductive wires 501 may electrically connect the first redistribution layer 111 to the conductive contacts of the second semiconductor chip 114. In FIG. 5B, an electrically insulating layer 503 (e.g., a molding) may be formed around the second semiconductor chips 114 and/or the wires 501. In FIG. 5C, a plurality of vias 505 (e.g., interconnect pathways) may be formed in the electrically insulating layer 505 to expose the first redistribution layer 111.

Figure 5D:
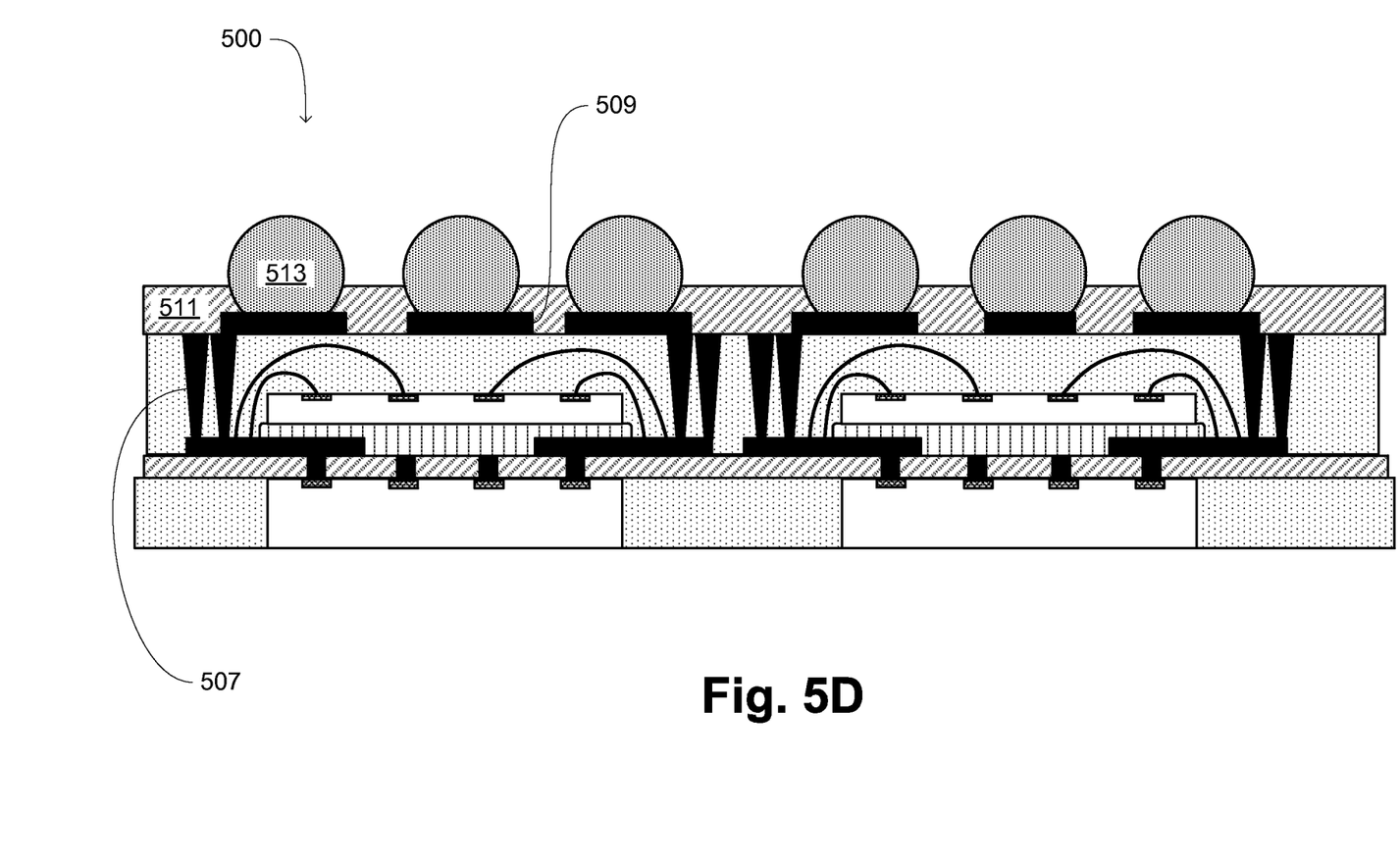

FIG. 5D illustrates an example of a semiconductor package 500 having at least two layers of stacked semiconductor chips and utilizing a wire bond stack for the second layer of semiconductor chips. From the method illustrated in FIG. 5C, the vias 505 may be filled with an electrically conductive material, a second redistribution layer 509 may be formed, an electrically insulating layer 511 (such as a dielectric) may be formed, and/or solder balls 513 (and solder stop) may be formed. Similar to other embodiments, the stacked sets of chips and/or other components may be separated (e.g., diced) to form smaller individual packages.

Figure 6A:
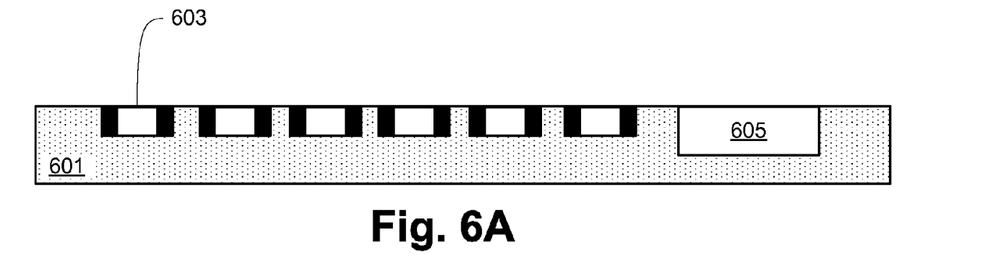
FIGS. 6A-6C illustrate examples of side cutaway views of a semiconductor device (or portions thereof) having active and/or passive components and/or an example method of manufacturing a semiconductor device having active and/or passive components in accordance with one or more aspects described herein.
Figure 6B:
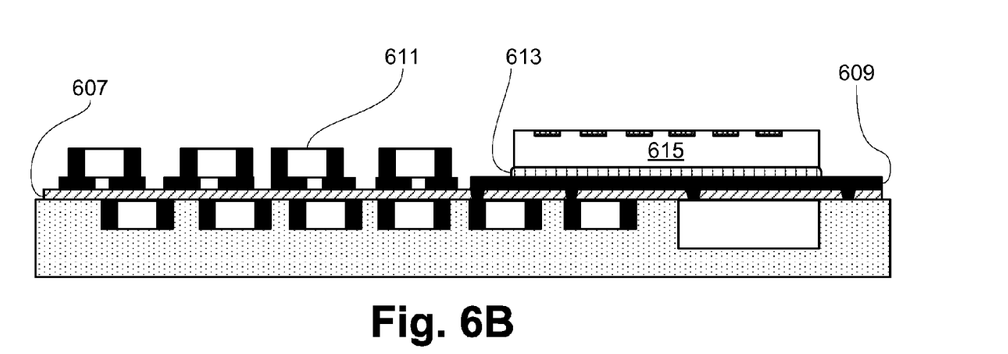
Figure 6C:
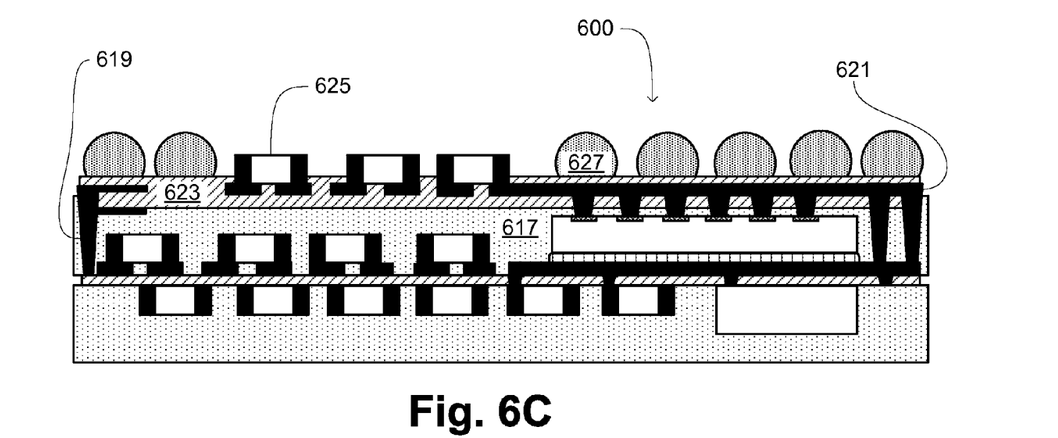

FIGS. 6A-6C illustrate examples of side cutaway views of a semiconductor device (or portions thereof) having active and/or passive components and/or an example method of manufacturing a semiconductor device having active and/or passive components in accordance with one or more aspects described herein. The semiconductor devices described herein may include any number of active and passive semiconductor chips. Active semiconductor chips may include, but are not limited to, integrated circuits, such as memory, baseband chips, processors, etc. Passive semiconductor chips may include, but are not limited to, surface mount devices (SMDs), integrated passive devices (IPDs), resistors, capacitors, diodes, inductors, and the like.

In FIG. 6A, a base layer 601 (e.g., a reconstituted wafer) may be provided. The base layer 101 may have a plurality of embedded active chips 605 and/or a plurality of embedded passive chips 603. In FIG. 6B, an electrically insulating layer 607 (e.g., a dielectric) may be formed on the reconstituted wafer 601. With the contacts of the chips 603 and/or 605 exposed, a first redistribution layer 609 may be formed on the semiconductor device. Additional active chips 615 and/or passive chips 611 may be placed in electrical connection with the first redistribution layer 609. For example, active chip 615 may be structurally connected to the insulating layer 607 by an adhesive 613. As previously described, the active side of active chip 615 may be face up in examples illustrated in FIG. 1 (e.g., an RDL connection) and FIG. 5 (e.g., a wire bond connection). The contacts of the chip 615 may be covered with a metal structure (e.g., a copper pillar), as previously described. Alternatively, the active side of chip 615 may be face down in examples illustrated in FIG. 4 (e.g., a flip chip connection).

In FIG. 6C, an electrically insulating layer 617 (e.g., a photostructurable electrically insulating layer) may be formed around the second layer of active chips 615 and/or passive chips 611. The first redistribution layer 609 and/or other conductive contacts (e.g., contacts on the active chips and/or passive chips) may be exposed (e.g., by laser drilling, photolithography, etc.), and conductive filler 619 may be used to electrically connect the first redistribution layer to upper layers. A second redistribution layer 621 and an electrically insulating layer 623 (e.g., a dielectric) may be formed on the semiconductor device. Additional active chips and/or passive chips 625 may be positioned in electrical connection with the second redistribution layer 621. Solder balls 627 may be positioned in electrical connection with the second redistribution layer 621 to form the semiconductor package 600 having a plurality of passive and/or active components. Similar to other embodiments, the stacked sets of chips and/or other components may be separated (e.g., diced) to form smaller individual packages.

Figure 7:
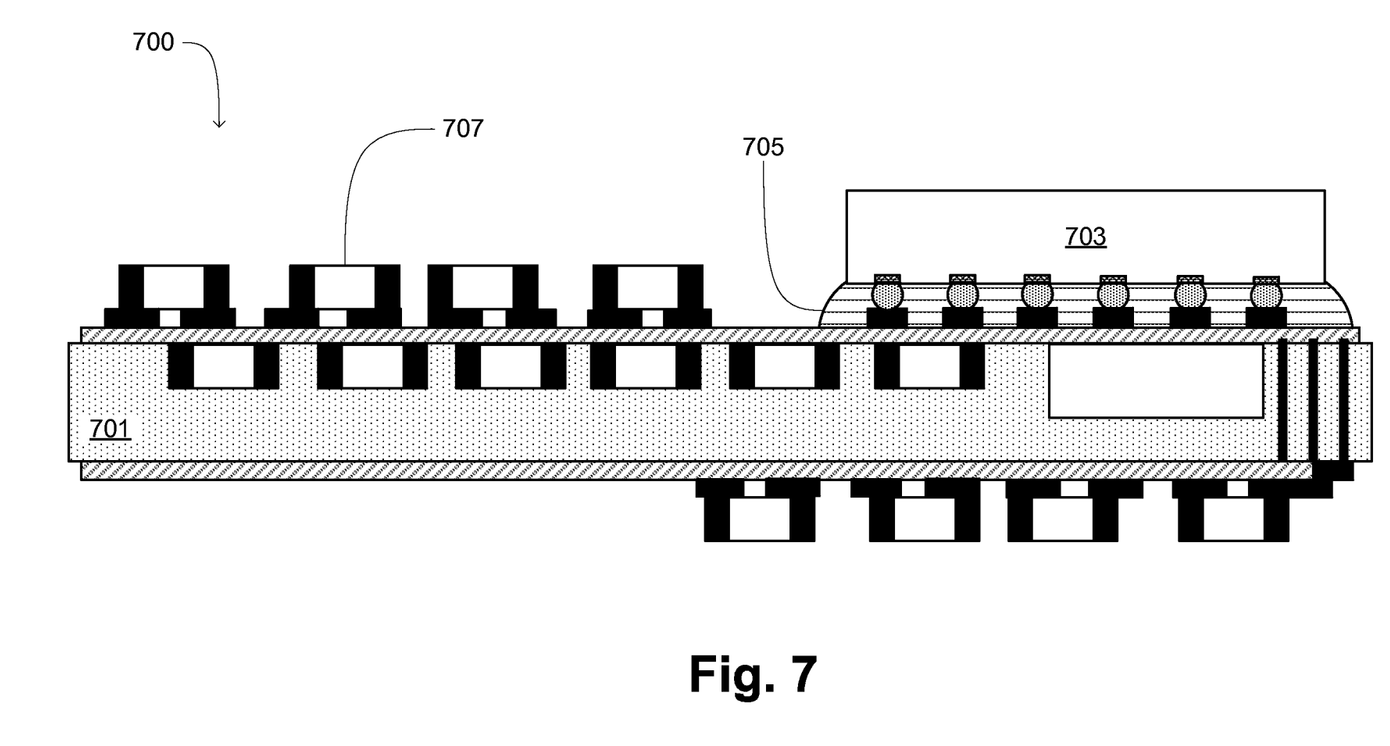
FIG. 7 illustrates another example of a side cutaway view of a semiconductor device (or portion thereof) having active and/or passive components in accordance with one or more aspects described herein.

FIG. 7 illustrates another example of a side cutaway view of a semiconductor device 700 (or portion thereof) having active and/or passive components in accordance with one or more aspects described herein. Semiconductor device 700 may have a base layer 701 (e.g., a reconstituted wafer) having embedded passive and/or active chips. The semiconductor device 700 may have one or more additional layers of active and/or passive chips and/or packages, such as an active flip chip package 703 and a plurality of passive chips 707. The flip chip package 703 may be underfilled with fill material 705 after the flip chip package has been placed in electrical connection with a redistribution layer (e.g., via soldering, thermocompression bonding, etc.). Similar to other embodiments, the stacked sets of chips and/or other components may be separated (e.g., diced) to form smaller individual packages.

While various embodiments have been illustrated and described, there are merely examples. The words used in this specification are words of description rather than limitation, and it is understood that various changes may be made without departing from the spirit and scope of the present disclosure.

The invention claimed is:

1. A semiconductor device, comprising:
   a base layer having a first semiconductor chip, the first semiconductor chip having at least one electrically conductive contact at a first side of the first semiconductor chip, wherein the first semiconductor chip is attached directly to the base layer;

a first redistribution layer contacting the at least one electrically conductive contact of the first semiconductor chip, wherein the first redistribution layer extends beyond the boundary of the first semiconductor chip;

a second semiconductor chip having a first side and a second side, the second semiconductor chip having at least one electrically conductive contact at the first side of the second semiconductor chip;

an electrically insulating layer positioned to at least partially encapsulate the second semiconductor chip, wherein the electrically insulating layer has at least one via exposing the first redistribution layer; and an adhesive layer positioned between the first side of the first semiconductor chip and the second side of the second semiconductor chip, wherein the second semiconductor chip is positioned directly on the adhesive layer.

2. The semiconductor device of claim 1, further comprising:

a second redistribution layer contacting the at least one electrically conductive contact of the second semiconductor chip, wherein the second redistribution layer is electrically connected to the first redistribution layer by the at least one via.

3. The semiconductor device of claim 2, further comprising:

at least one solder ball contacting the second redistribution layer.

4. The semiconductor device of claim 2, further comprising:

a third semiconductor chip having a first side and a second side, the third semiconductor chip having at least one electrically conductive contact at the first side of the third semiconductor chip;

a second adhesive layer positioned between the first side of the second semiconductor chip and the second side of the third semiconductor chip, wherein the third semiconductor chip is positioned directly on the second adhesive layer;

a second electrically insulating layer to at least partially encapsulate the third semiconductor chip, wherein the second electrically insulating layer has at least one via exposing the second redistribution layer; and a third redistribution layer contacting the at least one electrically conductive contact of the third semiconductor chip, wherein the third redistribution layer is electrically connected to the second redistribution layer by the at least one via of the second electrically insulating layer.

5. The semiconductor device of claim 1, wherein the base layer is a reconstituted wafer and wherein the first semiconductor chip is embedded in the reconstituted wafer.

6. The semiconductor device of claim 5, wherein a plurality of semiconductor chips are embedded in the reconstituted wafer.

7. The semiconductor device of claim 6, wherein the plurality of semiconductor chips include at least one passive semiconductor chip and at least one active semiconductor chip.

8. The semiconductor device of claim 1, wherein the first semiconductor chip and the second semiconductor chip form a single integrated circuit package.

9. The semiconductor device of claim 1, wherein the adhesive layer is positioned at least partially on the first redistribution layer.

10. The semiconductor device of claim 1, wherein the first semiconductor chip and the second semiconductor chip are integrated circuits.

* * * * *